(12) United States Patent
Kinoshita et al.

(10) Patent No.: US 7,598,121 B2
(45) Date of Patent: Oct. 6, 2009

(54) METHOD OF MANUFACTURING A SEMICONDUCTOR DEVICE

(75) Inventors: Nobuhiro Kinoshita, Kodaira (JP); Jumpei Konno, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 142 days.

(21) Appl. No.: 11/648,646

(22) Filed: Jan. 3, 2007

(65) Prior Publication Data

US 2007/0111384 A1 May 17, 2007

Related U.S. Application Data

(63) Continuation of application No. 11/017,077, filed on Dec. 21, 2004, now abandoned.

(30) Foreign Application Priority Data

Dec. 24, 2003 (JP) ............................. 2003-426943

(51) Int. Cl.
*H01L 21/16* (2006.01)

(52) U.S. Cl. ...................... 438/108; 438/106; 438/109

(58) Field of Classification Search ........................ None
See application file for complete search history.

(56) References Cited

U.S. PATENT DOCUMENTS

| 6,258,626 B1 | 7/2001 | Wang et al. |
| 6,653,171 B2 | 11/2003 | Ikegami |
| 6,656,765 B1 | 12/2003 | DiCaprio |
| 2002/0132463 A1 | 9/2002 | Urushima |
| 2003/0022603 A1 | 1/2003 | Tsao et al. |

FOREIGN PATENT DOCUMENTS

| CN | 1334601 A | 2/2002 |
| JP | 11-067842 | 3/1999 |
| JP | 2000-216193 | 8/2000 |

OTHER PUBLICATIONS

Chinese Official Action dated Apr. 25, 2008 for Application No. 200410104886.0.

*Primary Examiner*—Zandra V. Smith
*Assistant Examiner*—Pamela E Perkins
(74) *Attorney, Agent, or Firm*—Antonelli, Terry, Stout & Kraus, LLP.

(57) ABSTRACT

A method of manufacturing a semiconductor device includes the steps of: grinding the rear surface of a semiconductor wafer to reduce its thickness; flattening the rear surface of the semiconductor wafer; dividing the semiconductor wafer into a plurality of semiconductor chips; forming gold bumps on the electrodes of the plurality of semiconductor chips; applying NCP to the front surface of a packaging board; and arranging the semiconductor chips over the packaging board through the NCP and pressing the back surfaces of the semiconductor chips to flip-chip bond the semiconductor chips to the packaging board. Therefore, it is possible to prevent NCP from rising onto the back surfaces of the semiconductor chips at the time of flip-chip bonding, whereby separation and cracking caused by a high-temperature treatment for assembly and mounting of a semiconductor device can be prevented and the reliability of the semiconductor device can be improved.

19 Claims, 13 Drawing Sheets

METHOD OF MANUFACTURING A SEMICONDUCTOR DEVICE

CROSS-REFERENCE TO RELATED APPLICATION

The present application claims priority from Japanese patent application No. 2003-426943, filed on Dec. 24, 2003, the content of which is hereby incorporated by reference into this application. This application is a Continuation application of application Ser. No. 11/017,077, filed Dec. 21, 2004 now abandoned, the contents of which are incorporated herein by reference in their entirety.

BACKGROUND OF THE INVENTION

The present invention relates in general to a semiconductor device and to a method of manufacturing the same. Specifically, it relates to a technology that may be effectively used for flip-chip bonding.

For conventional flip-chip bonding using an adhesive, a semiconductor device having multi-stepped flanks is bonded to a circuit board. The semiconductor device and the circuit board are thermally bonded together through a detection member or an interposed member having a multi-layered structure, and the interposed member is broken or separated so as to be removed as required after bonding (refer to, for example, patent document 1).

[Patent document 1] Japanese Unexamined Patent Publication No. 2000-216193 (FIG. 1)

SUMMARY OF THE INVENTION

As an example of a semiconductor device making use of flip-chip bonding, there is a multi-chip semiconductor device comprising multiple layers of semiconductor chips, in which the semiconductor chip of the lowest layer is flip-chip bonded to a wiring substrate.

The above-described multi-chip semiconductor device will desirably have a narrower pitch of pads (electrodes) from the point of view of size reduction of the semiconductor device and an increase in the number of pins. As one means of reducing the size (thickness) of the semiconductor device, it is proposed to reduce the thickness of the semiconductor chip. That is, the semiconductor chip is made thin by grinding its rear surface.

In addition, due to a reduction in the pitch of the pads, it is becoming very difficult to effect under-fill sealing of a flip-chip bonded portion of such a semiconductor device because the permeation of a resin takes time. Therefore, to dial with this problem, an adhesive is applied to a wiring substrate before semiconductor chips are mounted, and then the semiconductor chips are placed on the adhesive and flip-chip bonded, accompanied by the application of pressure and heat.

The inventors of the present invention have conducted studies on the technology used for grinding the rear surface of the semiconductor chip of the lowermost layer and pre-coating an adhesive in a multi-chip semiconductor device and have found the following problem.

That is, when the back surface of the semiconductor chip is pressed to effect thermal contact bonding of the semiconductor chip, the adhesive pressed by the semiconductor chip rises along the side walls of the semiconductor chip and reaches the back surface of the semiconductor chip. When grinding marks (unevenness) remain on the back surface of the semiconductor chip, the adhesive rises onto the back surface by flowing through the grinding marks at the edge of the chip, whereby the adhesive adheres to the back surface of the semiconductor chip forming the lowermost layer. The adhesive is, for example, an epoxy-based non-conductive (insulating) resin adhesive, mainly a thermosetting resin.

When the resin adhesive adheres to the back surface of the semiconductor chip in this way, the semiconductor chip separates from a sealing resin, or from a die bonding agent (resin adhesive) for the second layer of the semiconductor chip, because the resin adhesive has poor adhesion to the other resin, and water collects at the site of this separation. When assembly is continued in this state, the water expands in response to the heat applied during a high-temperature treatment (such as solder reflow or the mounting of a substrate) which is carried out later, and the semiconductor device cracks at the above-mentioned separation site.

It is an object of the present invention to provide a semiconductor device and a method of manufacturing the same, in which the reliability of the device can be improved.

It is another object of the present invention to provide a semiconductor device which has a reduced thickness and a method of manufacturing the same.

The above and other objects and features of the present invention will become apparent from the following description when taken in conjunction with the accompanying drawings.

Typical aspects and features of the invention disclosed in the present specification will be briefly described below.

That is, according to a first aspect of the present invention, there is provided a semiconductor device comprising: a wiring substrate having a front surface and a rear surface; a first semiconductor chip, having a main surface and a back surface, which is flip-chip bonded to the front surface of the wiring substrate through projecting electrodes; a second semiconductor chip having a main surface and a back surface, which is mounted over the first semiconductor chip by bonding it's the back surface thereof to the back surface of the first semiconductor chip with an adhesive; a non-conductive resin adhesive interposed between the wiring substrate and the first semiconductor chip; and a sealing body, formed over the front surface of the wiring substrate, for resin sealing the first and second semiconductor chips, wherein the first semiconductor chip is made thin by grinding its back surface, and the back surface is made flat by polishing after grinding.

According to a second aspect of the present invention, there is provided a method of manufacturing a semiconductor device, comprising the steps of:

(a) grinding the rear surface of a semiconductor wafer to reduce its thickness;

(b) after the step (a), flattening the rear surface of the semiconductor wafer;

(c) after the step (b), dividing the semiconductor wafer into a plurality of semiconductor chips;

(d) after the step (c), forming projecting electrodes on the plurality of semiconductor chips;

(e) applying a non-conductive resin adhesive to the front surface of a wiring substrate;

(f) arranging the semiconductor chips over the front surface of the wiring substrate through the resin adhesive and pressing a back surfaces of the semiconductor chips to flip-chip bond the semiconductor chips to the wiring substrate through the projecting electrodes; and (g) sealing the semiconductor chips with a resin.

According to a third aspect of the present invention, there is provided a method of manufacturing a semiconductor device, comprising the steps of:

(a) grinding the rear surface of a semiconductor wafer to reduce its thickness;

(b) after the step (a), planishing the rear surface of the semiconductor wafer;
(c) after the step (b), dividing the semiconductor wafer into a plurality of semiconductor chips;
(d) after the step (c), forming projecting electrodes on the plurality of semiconductor chips;
(e) applying a non-conductive resin adhesive to the front surface of a wiring substrate;
(f) arranging the semiconductor chips over the front surface of the wiring substrate through the resin adhesive;
(g) after the step (f), pressing the planished back surfaces of the semiconductor chips to flip-chip bond the semiconductor chips to the wiring substrate through the projecting electrodes; and
(h) sealing the semiconductor chips with a resin.

According to a fourth aspect of the invention, there is provided a method of manufacturing a semiconductor device, comprising the steps of:
(a) preparing a plurality of semiconductor chips, each having a main surface and a back surface, the back surface being ground to be made thin, and being flattened after grinding;
(b) forming projecting electrodes on the electrodes of the plurality of semiconductor chips;
(c) applying a non-conductive resin adhesive to the front surface of a wiring substrate;
(d) arranging the semiconductor chips over the front surface of the wiring substrate through the resin adhesive;
(e) pressing the flattened back surfaces of the semiconductor chips to flip-chip bond the semiconductor chips to the wiring substrate through the projecting electrodes; and
(f) sealing the semiconductor chips with a resin.

The effect obtained from typical features of the invention disclosed in the present patent application will be briefly described as follows.

The rear surface of the semiconductor wafer is ground to reduce the thickness, and, further, irregularities on the rear surface of the semiconductor wafer are removed by flattening the rear surface. Thereby, it is possible to prevent the resin adhesive from rising onto the back surface of a chip during flip-chip bonding, and to prevent separation between the back surface of the chip and the sealing resin and between the back surface of the chip and the die bonding material of a second semiconductor chip. As a result, the above-described separation and cracking previously caused by a high-temperature treatment used during assembly or mounting of a semiconductor device can be prevented. Accordingly, the reliability of the semiconductor device can be improved.

DETAILED DESCRIPTION OF THE PREFERRED EMBODIMENT

A description of the same or similar parts is not repeated in the following description of the embodiments, unless it is especially necessary.

Further, in the following description of the embodiments, if necessary for convenience's sake, the present invention may be described as a plurality of sections or embodiments, but they are not to be considered irrelevant to each other, to be considered as one is a modification, detailed description or complementary explanation of part or all of the other, unless otherwise stated.

In the following description of the embodiments, when numerical figures (including the number, numerical value, amount and range) for elements are referred to, it is to be understood that the present invention is not limited to these specific numerical figures and may be larger than and smaller than the specified numerical figures, unless they are clearly specified and obviously limited to the specific figures theoretically.

Preferred embodiments of the present invention will be described in detail with reference to the accompanying drawings. In all the figures, members having the same function are given the same reference symbols, and a repeated description thereof will be omitted.

Embodiments

Figure 1:
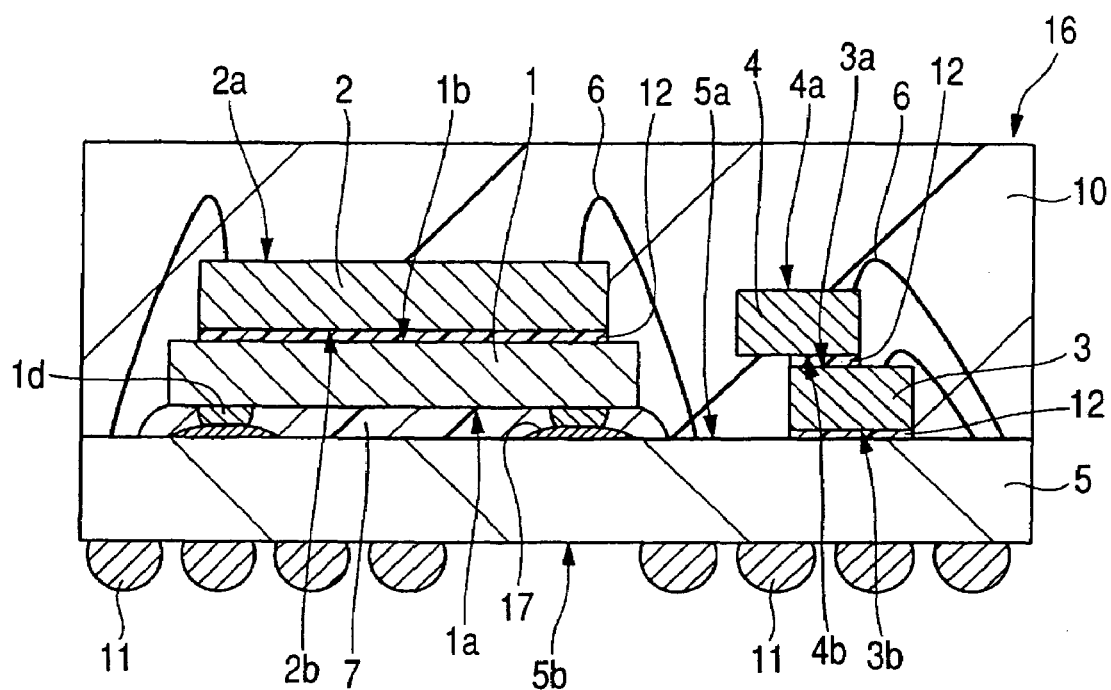
FIG. 1 is a sectional view of a semiconductor device according to an embodiment of the present invention.

The semiconductor device of the embodiment shown in FIG. 1 has a structure in which a semiconductor chip is flip-chip bonded to a wiring substrate. In this embodiment, an SIP (System In Package) 16 having four semiconductor chips and which is sealed with a resin will be described as an example of the above-mentioned semiconductor device.

The SIP 16 comprises a first semiconductor chip 1 for control, a second semiconductor chip 2, a third semiconductor chip 3 and a fourth semiconductor chip 4, each having a memory circuit. The first semiconductor chip 1 of these semiconductor chips is flip-chip bonded to a packaging board 5, which serves as a wiring substrate, through projecting electrodes, and the second semiconductor chip 2 is formed over the first semiconductor chip 1. The third semiconductor chip 3 is mounted over the packaging board 5, and the fourth semiconductor chip 4 is mounted over the third semiconductor chip 3 in such a manner that their main surfaces 3a and 4a face up.

Only the first semiconductor chip 1 is flip-chip bonded to the packaging board 5. The second semiconductor chip 2, the third semiconductor chip 3 and the fourth semiconductor chip 4 are wired to the packaging board 5.

As for the detailed structure of the SIP 16 shown in FIG. 1, the SIP 16 comprises the packaging board 5, which serves as a wiring substrate having a front surface 5a and a rear surface 5b; the first semiconductor chip 1 which has a main surface 1a and a back surface 1b and is flip-chip bonded to the front surface 5a of the packaging board 5 through projecting electrodes; the second semiconductor chip 2, which has a main surface 2a and a back surface 2b and is formed over the first semiconductor chip 1 in such a manner that its back surface 2b is connected to the back surface 1b of the first semiconductor chip 1 by a die bonding agent (adhesive) 12; the third semiconductor chip 3, which is formed over the front surface 5a of the packaging board 5 in such a manner that its main surface 3a faces up; the fourth semiconductor chip 4, which is formed over the main surface 3a of the third semiconductor chip 3 in such a manner that its main surface 4a faces up; a NCP (Non-Conductive Paste) 7, which is a non-conductive resin adhesive interposed between the front surface 5a of the packaging board 5 and the first semiconductor chip 1; a plurality of wires 6 for electrically connecting the second, third and fourth semiconductor chips to the packaging board 5; a sealing body 10 for sealing the four semiconductor chips and the plurality of wires 6 with a resin; and a plurality of solder balls 11, which serve as external terminals formed on the rear surface 5b of the packaging board 5.

Further, the back surface 1b of the first semiconductor chip 1 of the SIP 16 is made thin by grinding and flat by polishing after grinding. That is, the back surface 1b is planished.

The back surface 1b of the first semiconductor chip 1 is ground to reduce the thickness of the semiconductor chip 1 to about 140 μm. The other three semiconductor chips may be made thin likewise, as required.

The first semiconductor chip 1 is flip-chip bonded to the packaging board 5 by gold bumps (projecting electrodes) 1d, which are soldered to the packaging board 5 for flip-chip bonding. The NCP 7, which is a resin adhesive, is interposed between the packaging board 5 and the first semiconductor chip 1 to harden and protect the flip-chip bonded portions. The NCP 7 is, for example, an epoxy-based non-conductive (insulating) thermosetting resin adhesive.

The second semiconductor chip 2, the third semiconductor chip 3 and the fourth semiconductor chip 4 are fixed by the die bonding agent 12. That is, as the second semiconductor chip 2 is formed over the first semiconductor chip 1, the back surface 1b of the first semiconductor chip 1 is bonded to the back surface 2b of the second semiconductor chip 2 by the die bonding agent 12. Further, as the back surface 3b of the third semiconductor chip 3 is bonded to the packaging board 5 by the die bonding agent 12, and the fourth semiconductor chip 4 is formed over the main surface 3a of the third semiconductor chip 3, the main surface 3a of the third semiconductor chip 3 and the back surface 4b of the fourth semiconductor chip 3 are bonded together by the die bonding agent 12.

Due to the above-described arrangement, the main surface 2a of the second semiconductor chip 2, the main surface 3a of the third semiconductor chip 3 and the main surface 4a of the fourth semiconductor chip 4 face up and can be wired.

The die bonding agent 12 is, for example, an epoxy-based non-conductive (insulating) thermosetting resin adhesive as well. The sealing resin for forming the sealing body 10 is, for example, an epoxy-based insulating thermosetting resin. The wire 6 is a conductive wire, for example, a gold wire.

The plurality of external terminals on the rear surface 5b of the packaging board 5 are solder balls 11, and they are arranged in a lattice on the rear surface 5b of the packaging board 5. That is, the SIP 16 of this embodiment is also a BGA (Ball Grid Array) type semiconductor device.

Figure 5:
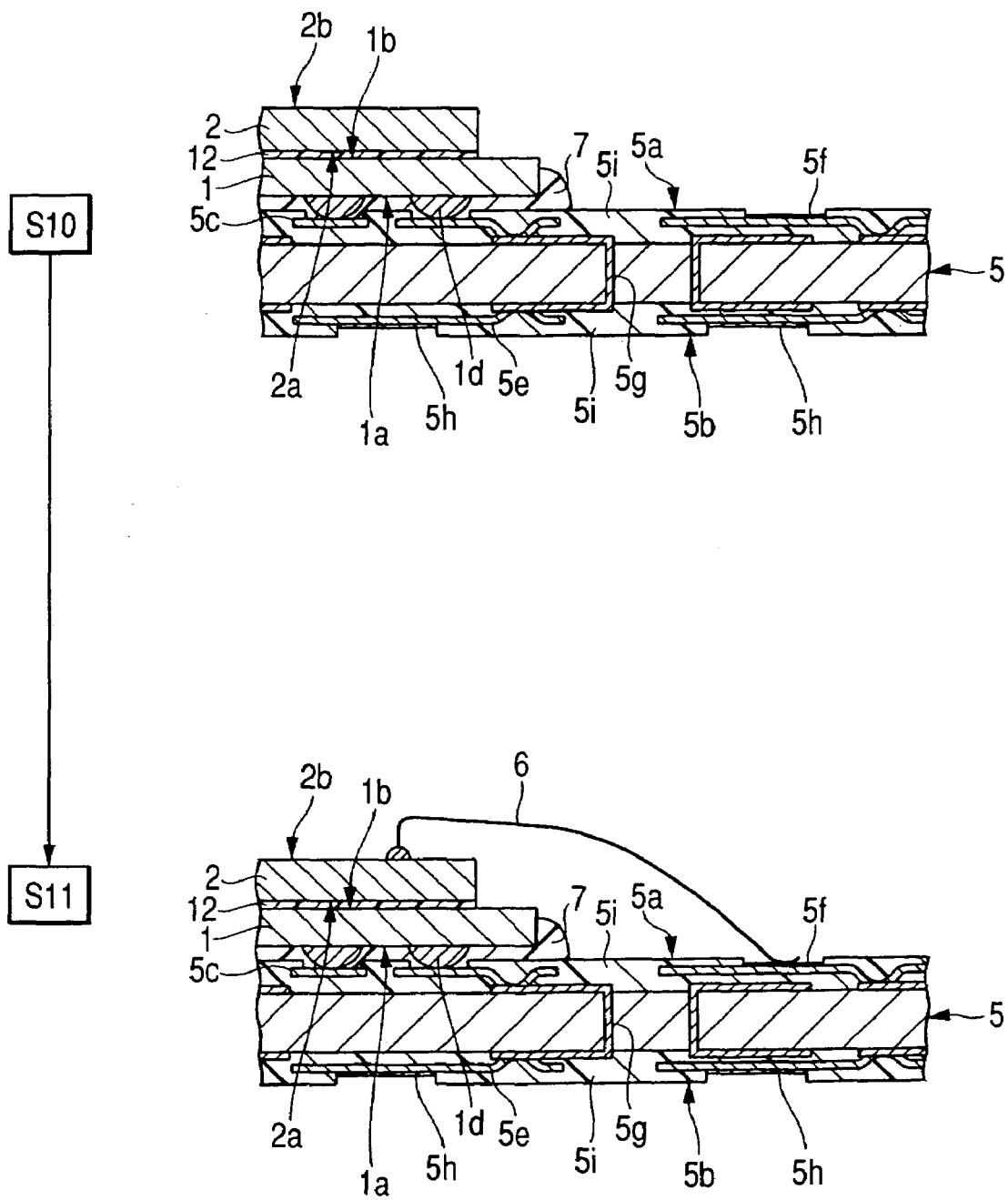
FIG. 5 is a flow diagram showing in sectional view the assembly states corresponding to steps S10 and S11 of the assembly flow shown in FIG. 2.

As shown in FIG. 5, a plurality of leads (electrodes) 5c and a plurality of wire connection leads 5f are formed on the front surface 5a of the packaging board 5, and the areas of the front surface 5a, excluding these exposed portions are covered with a solder resist film 5i, which is an insulating film. Bump lands 5h, on which the solder bumps 11 are formed, are provided on the rear surface 5b. The leads 5c and the wire connection leads 5f on the front surface 5a are electrically connected to the bump lands 5h on the rear surface 5b by internal wires 5e and through hole wires 5g.

Thereby, the electrodes of the semiconductor chips are electrically connected to the solder balls 11, which constitute external terminals formed on the rear surface 5b of the packaging board 5. The leads 5c, the wire connection leads 5f and the through hole wires 5g are made of copper alloy.

Figure 10:
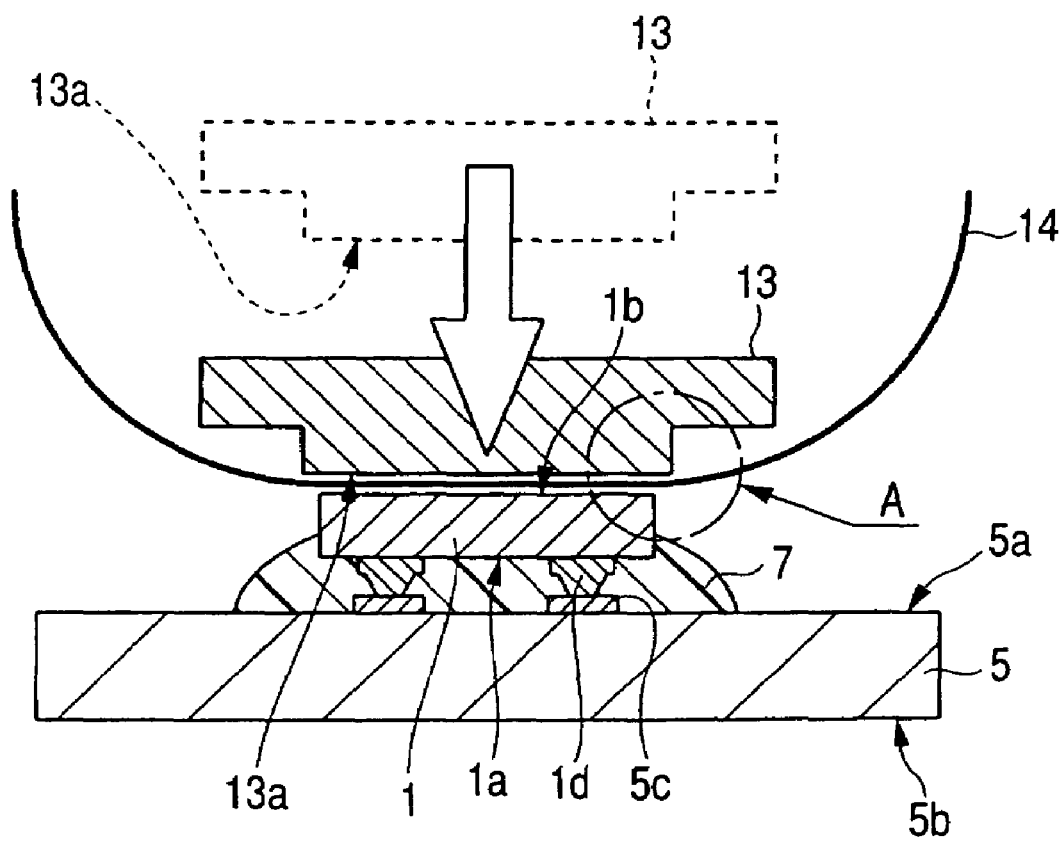
FIG. 10 is a sectional view showing a main contact bonding method in the FC mounting step of the assembly flow shown in FIG. 2.

In the SIP 16 of this embodiment, the first semiconductor chip 1, which is flip-chip bonded to the packaging board 5, is made thin by grinding (also called "back-grinding") the back surface 1b before the wafer is divided into chips and flattened by polishing or wet-etching after grinding. Therefore, the back surface 1b has a high flatness. Consequently, since the irregularities 9c in the Comparative Example shown in FIG. 14 are not formed on the back surface 1b of the first semiconductor chip 1, as shown in FIG. 10, it is possible to prevent the NCP 7 from rising up and flowing onto the back surface 1b, when pressure is applied thereto by a pressure block 13 for flip-chip bonding, and, therefore, the adhesion of the NCP 7 to the back surface 18a of the chip 18, as seen in the Comparative Example shown FIG. 15, is prevented.

As a result, separation between the back surface 1b of the first semiconductor chip 1 and the sealing body 10, and between the back surface 1b of the first semiconductor chip 1 and the die bonding agent 12 of the semiconductor chip 2, can be prevented, and also the consequent separation or cracking caused by a high-temperature treatment for forming the solder balls 11 or for mounting the substrate can be prevented. Thereby, the reliability of a semiconductor device, such as the SIP 16, can be improved.

Figure 14:
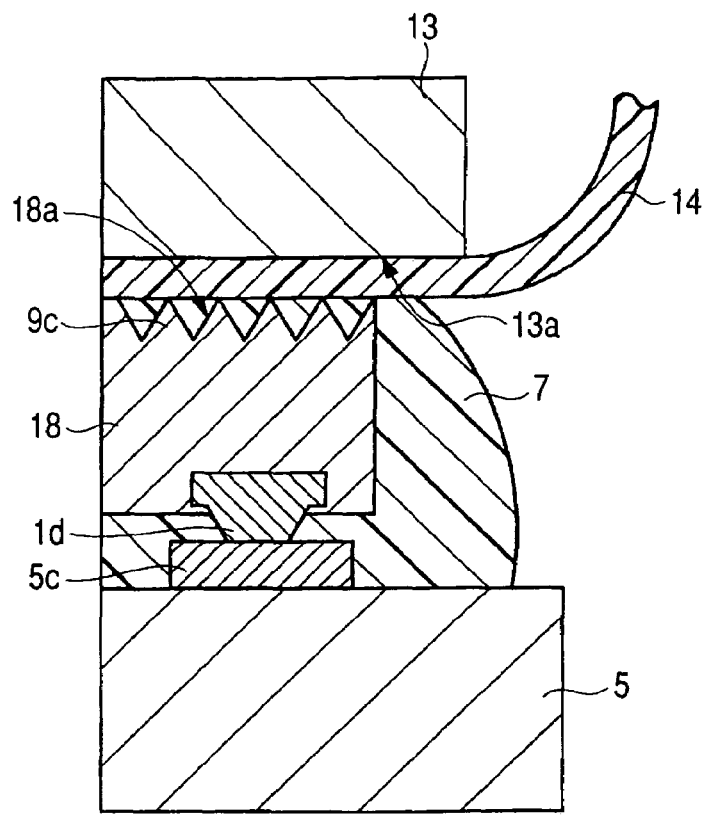
FIG. 14 is a partially enlarged sectional view showing the contact bonding method of a Comparative Example, in contrast to the main contact bonding method shown in FIG. 10.
Figure 15:
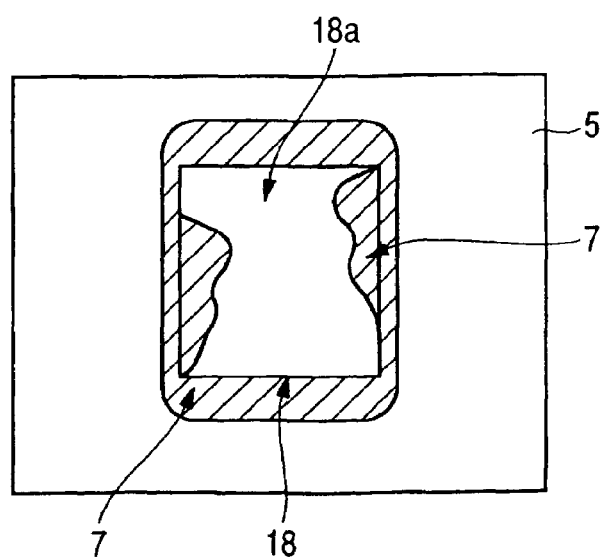
FIG. 15 is a plan view showing the adhesion of a resin adhesive to a back surface of a chip by the contact bonding method of the Comparative Example shown in FIG. 14.

Since the flip-chip bonded first semiconductor chip 1 is flattened by polishing or wet-etching after grinding is applied to its back surface, and more of the irregularities 9c shown in FIG. 14 remain on the back surface 1b, the bending strength of the first semiconductor chip 1 can be improved.

Therefore, the breakage of the chip, which occurs when it is pressed by the pressure block 13 for flip-chip bonding, can be prevented, and the second semiconductor chip 2 can be formed over the first semiconductor chip 1, which has been reduced in thickness. That is, since a thin chip can be used for flip-chip bonding, a multi-chip semiconductor device, such as the SIP 16, can be reduced in thickness and size.

The above-described back-grinding step is characterized in that the grinding speed is faster, but the surface roughness of the back surface after the end of the step is higher than that produced by the above-referenced polishing step or wet-etching step. It is possible to employ only back-grinding to reduce the thickness of a wafer. In this case, however, as described above, the rising of the adhesive caused by pressure applied thereto and a flowing of the adhesive onto the back surface of the chip due to the high roughness of the back surface of the chip becomes a problem to be solved. It is also possible to employ only polishing or wet-etching for obtaining a very flat surface reduce the thickness of the wafer. In this case, since the polishing or wet-etching step has a lower thickness reducing speed than the back-grinding step, the time required for the step becomes long the and productivity is reduced. In order to improve the flatness of the back surface of the chip, while maintaining a good productivity, a step of reducing the thickness at a high speed, for example, by back-grinding, should be first carried out to reduce the thickness of the wafer to a certain degree, followed by the step of increasing the flatness of the rear surface, for example, by polishing or wet-etching, to further reduce the thickness of the wafer. In this case, to maintain the desired productivity, the step of reducing the thickness of the wafer at a high speed is preferably employed so as to reduce the thickness by more than half to achieve a thickness close to the final thickness of the wafer.

A method of manufacturing a semiconductor device according to this embodiment will be described with reference to the assembly processing flow shown in FIG. 2.

Figure 2:
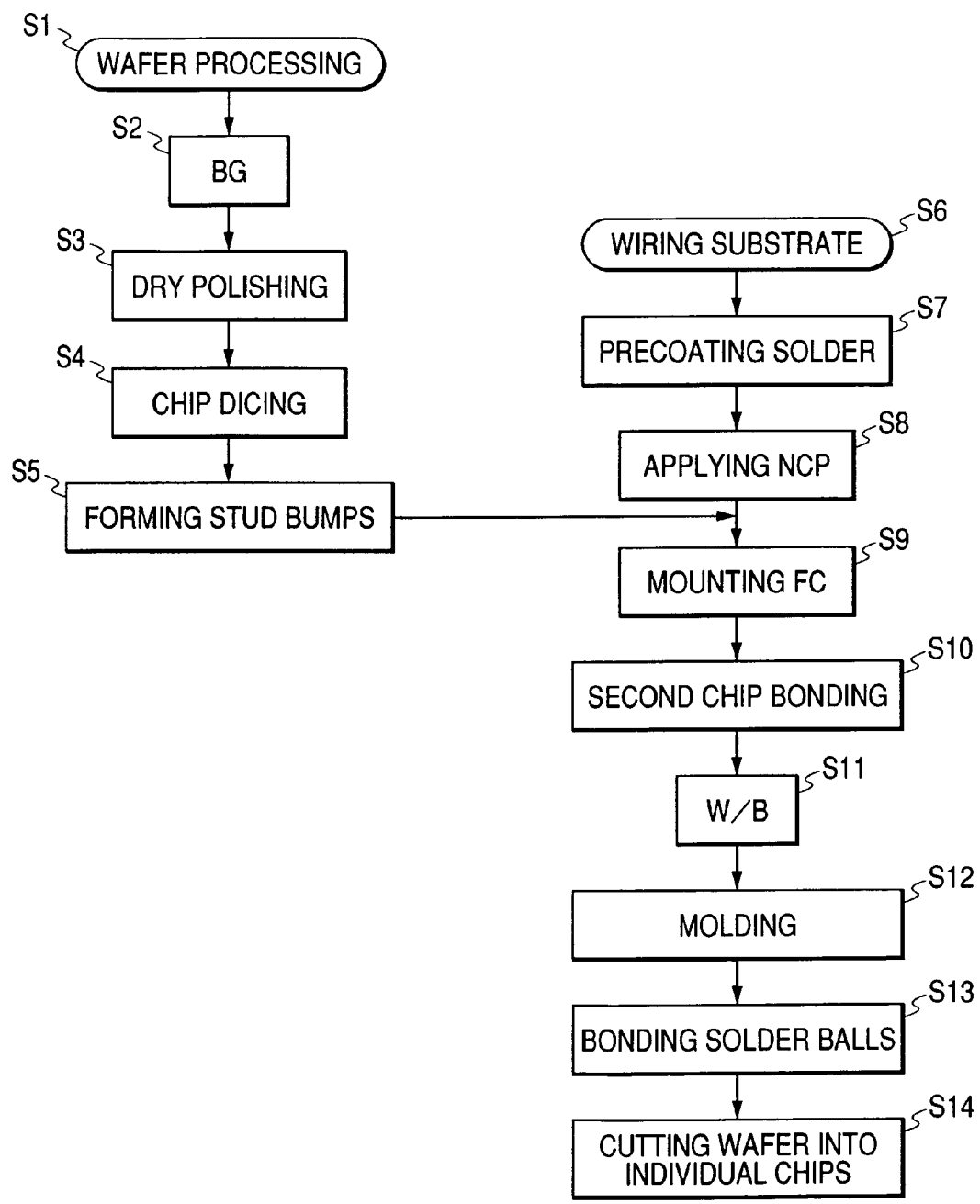
FIG. 2 is an assembly flow diagram showing a method of manufacturing the semiconductor device shown in FIG. 1.
Figure 7:
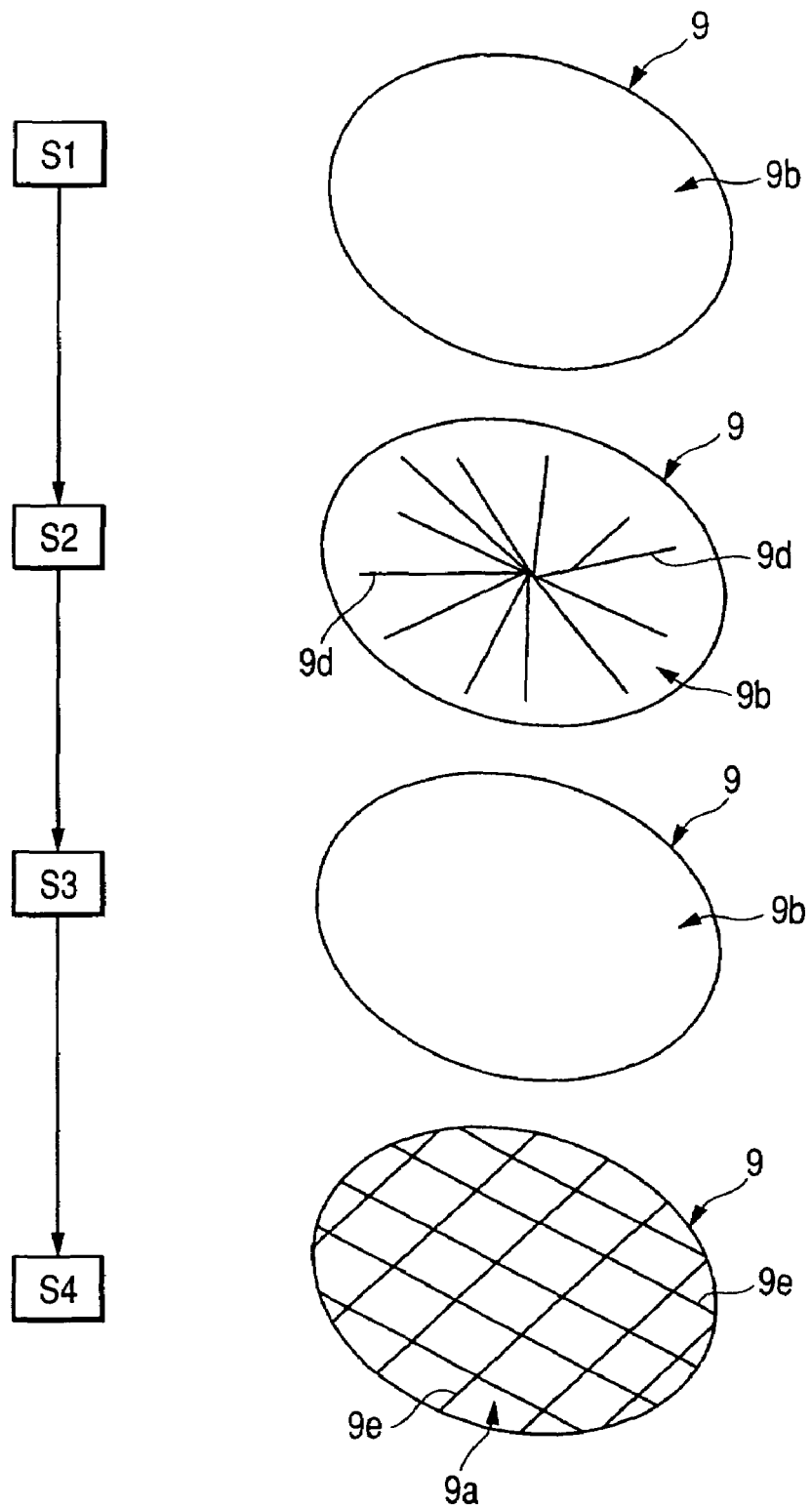
FIG. 7 is a flow diagram showing in perspective view the states of a wafer corresponding to steps S1 to S4 of the assembly flow shown in FIG. 2.

The processing of the wafer is first carried out in step S1 shown in FIG. 2. That is, as shown in step S1 in FIG. 3 and FIG. 7, a semiconductor wafer 9, having a pattern formed on the front surface 9a, is prepared.

Thereafter, BG (back grinding), as shown in step S2 of FIG. 2, is performed, that is, the rear surface 9a of the semiconductor wafer 9 is ground to reduce the thickness of the semiconductor wafer 9. As shown in step S2 of FIG. 3, irregularities 9c are formed on the rear surface 9b of the semiconductor wafer 9 by such grinding. The irregularities 9c are as large as about 0.05 to 0.1 μm, but they are not limited to this range. As shown in step S2 of FIG. 7, grinding marks 9d are formed radially on the rear surface 9b of the semiconductor wafer 9.

Thereafter, dry polishing, as shown in step S3 of FIG. 2 is carried out to flatten the rear surface 9b of the semiconductor wafer 9. In this step, the rear surface 9b of the semiconductor wafer 9 is planished by such dry polishing, as shown in step S3 of FIG. 7. Dry polishing is employed to grind (polish) the surface with a polishing cloth formed by compressing fibers impregnated with silica to about 2 μm. The irregularities 9c on the rear surface 9b of the semiconductor wafer 9 are as large as about 0.0015 μm after dry polishing.

Figure 3:
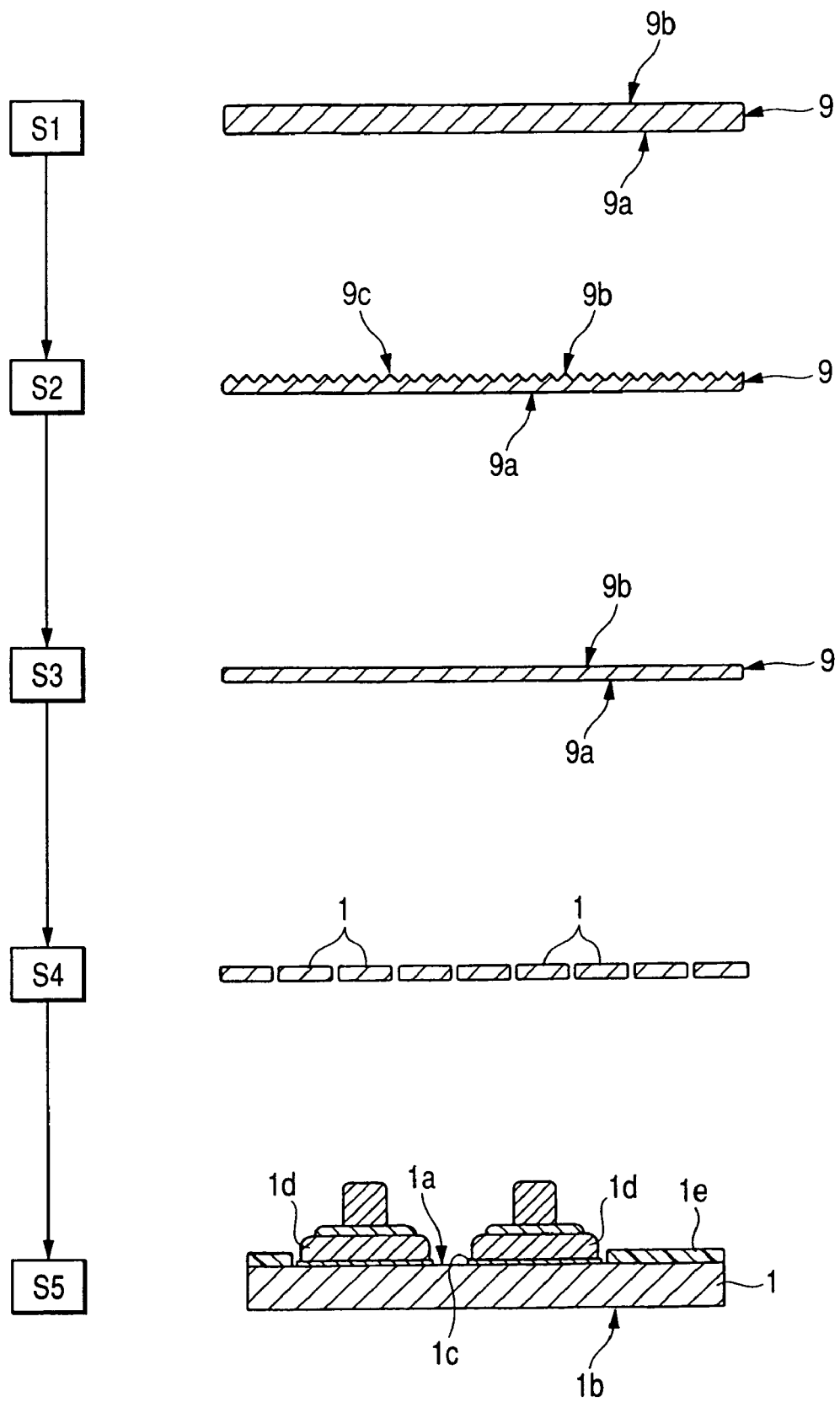
FIG. 3 is a flow diagram showing in sectional view the assembly states corresponding to steps S1 to S5 of the assembly flow shown in FIG. 2.

Thereby, the semiconductor wafer 9 is made thin, as shown in step S3 of FIG. 3. The thickness of the semiconductor wafer 9 which has been reduced in thickness is, for example, 140 μm and is set to this value as required (for example, the wafer can be made as thin as about 90 μm by back-grinding and dry polishing).

Not only dry polishing, but also wet etching, may be used for the flattening of the rear surface 9b of the semiconductor wafer 9 after back-grinding. In this case, the wet etching is in the form of spin etching, which is carried out by supplying fluoronitric acid while turning the semiconductor wafer 9 with a spinner, and it can make the irregularities 9c smaller than dry polishing.

Thereafter, chip dicing, as shown in step S4 of FIG. 2, is carried out. That is, the semiconductor wafer 9, which has been reduced in thickness, is cut so as to be divided into a plurality of semiconductor chips (first semiconductor chips 1), as shown in step S4 of FIG. 3. At this point, as shown in step S4 of FIG. 7, the semiconductor wafer 9 is diced along dicing lines 9e.

Since the irregularities 9c as seen in the Comparative Example shown in FIG. 14 are not formed on the back surface 1b of the first semiconductor chip 1, the bending strength of the first semiconductor chip 1 can be improved.

Thereafter, stud bumps are formed, as shown in step S5 of FIG. 2. That is, projecting electrodes are formed on a plurality of electrodes of the semiconductor chips. For example, a gold bump 1d is formed as the projecting electrode on the pads 1c, which are electrodes of the first semiconductor chip 1. Wire bonding technology is used to form the gold bumps 1d (the formed bumps are called "stud bumps") on the pads 1d of the first semiconductor chip 1. The areas around the sites where the pad 1c is formed of the main surface 1a of the first semiconductor chip 1 are covered with a surface protective film 1e.

The processing of the wiring substrate in steps S6 and seq. of FIG. 2 will be described hereinbelow.

Figure 4:
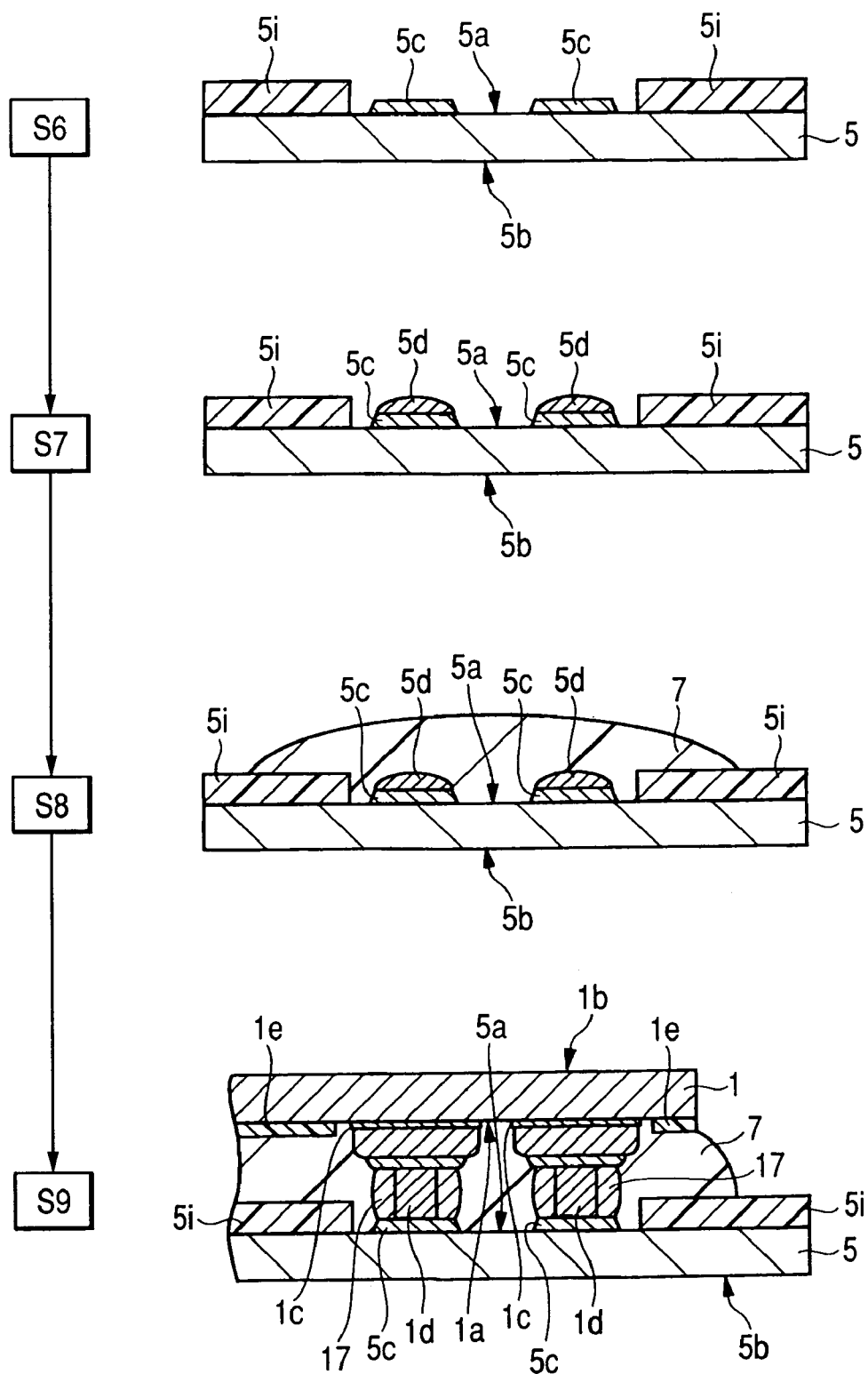
FIG. 4 is a flow diagram showing in sectional view the assembly states corresponding to steps S6 to S9 of the assembly flow shown in FIG. 2.

A packaging board 5, which constitutes the wiring substrate shown in step S6 of FIG. 4, is prepared. A plurality of leads 5c are formed on the front surface 5a of the packaging board 5, and a solder resist film 5i, which is an insulating film, is formed around the leads 5c.

Assembly of parts in step S6 and seq. of FIG. 2 may be carried out by using a multi-cavity substrate having a plurality of wiring substrates. In this embodiment, the assembly of one SIP 16 using the packaging board 5 will be described.

Thereafter, solder pre-coating in step S7 of FIG. 2 is carried out. That is, as shown in step S7 of FIG. 4, a solder pre-coat 5d is formed on the leads 5c to be flip-chip bonded on the front surface 5a of the packaging board 5. This solder pre-coat 5d is provided to enhance the solder bonding strength between the gold bumps 1d, which are projecting electrodes, and the leads 5c for flip-chip bonding.

Thereafter, NCP coating, as shown in step S8 of FIG. 2, is carried out. That is, as shown in step S8 of FIG. 4, an NCP 7, which is a non-conductive resin adhesive, is applied to the front surface 5a of the packaging board 5. The NCP 7 is, for example, a thermosetting resin.

In the method of manufacturing a semiconductor device according to this embodiment, before flip-chip bonding, the NCP 7 is arranged at portions of the packaging board 5 to be flip-chip bonded. This is because the gold bumps 1d become small when the pad pitch is narrowed to increase the number of pins, whereby the space between the semiconductor chip and the packaging board 5 becomes small (for example, 5 to 10 μm), thereby making it extremely difficult to inject a resin by under-fill sealing after the flip-chip bonding. Therefore, the NCP 7 is arranged on the packaging board 5. Even if the resin can be injected, since the above-mentioned space is narrow, it takes very long for the resin to flow between the chip and the substrate. Therefore, the NCP 7 is arranged on the packaging board 5 in advance.

Thereby, even when the pad pitch is reduced in size, the NCP 7, which is a non-conductive resin adhesive, can be inserted between the semiconductor chip and the packaging board 5.

Figure 8:
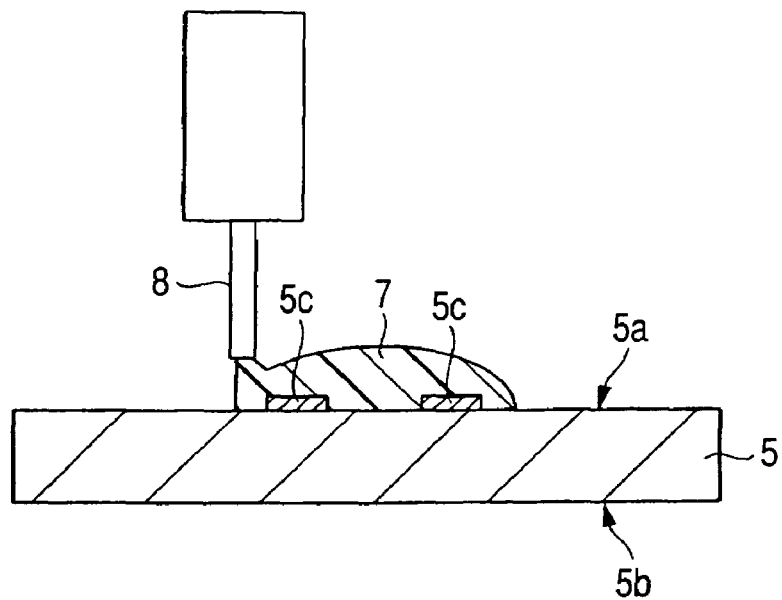
FIG. 8 is a sectional view showing an NCP application method in the NCP application step of the assembly flow shown in FIG. 2.

In this embodiment, as shown in FIG. 8, NCP 7 in the form of a paste is dropped on the front surface 5a of the packaging board 5 from a nozzle 8 so as to be applied to the front surface 5a. The non-conductive resin adhesive is not limited to a paste resin adhesive, but a film-like resin adhesive (for example, NCF (Non-Conductive Film)) may be used.

Preferably, the NCP 7 is applied as much as possible to cover the areas around the sides of the semiconductor chip to protect it.

Thereafter, FC (flip chip) mounting, that is, flip-chip bonding, as shown in step S9 of FIG. 2 and FIG. 4, is carried out.

Figure 9:
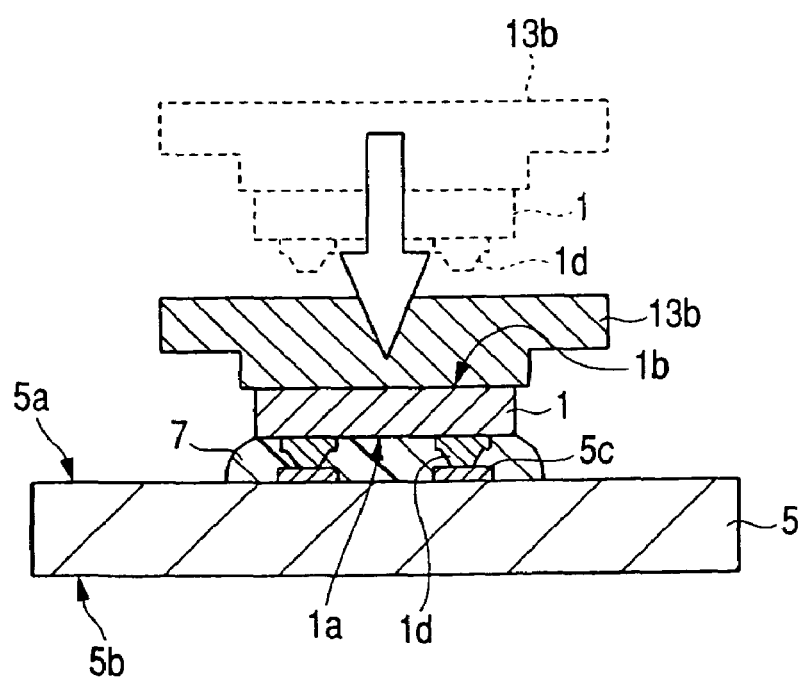
FIG. 9 is a sectional view showing a temporary mounting method in the FC mounting step of the assembly flow shown in FIG. 2.

First, as shown in FIG. 9, the first semiconductor chip 1, which has been adsorbed and carried by an adsorption block 13b, is temporarily mounted over the front surface 5a of the packaging board 5 the NCP 7 layer.

Subsequently, as shown in FIG. 10, the planished back surface 1b of the first semiconductor chip 1 is pressed by the pressure block 13 and heated so that the first semiconductor chip 1 is flip-chip bonded to the packaging board 5 through the gold bumps 1d. For example, the temperature of the pressure block 13 is set to 300° C. and the first semiconductor chip 1 is pressed by a load of 500 g. Heat applied from the pressure block 13 is transmitted to the first semiconductor chip 1 to melt the NCP 7 and the solder pre-coat 5d. That is, this is flip-chip bonding by thermal contact.

Thereby, the solder pre-coat 5d is heated to a molten state to bond the gold bumps 1d to the leads 5c by way of the solder 17, as shown in step S9 of FIG. 4.

Figure 11:
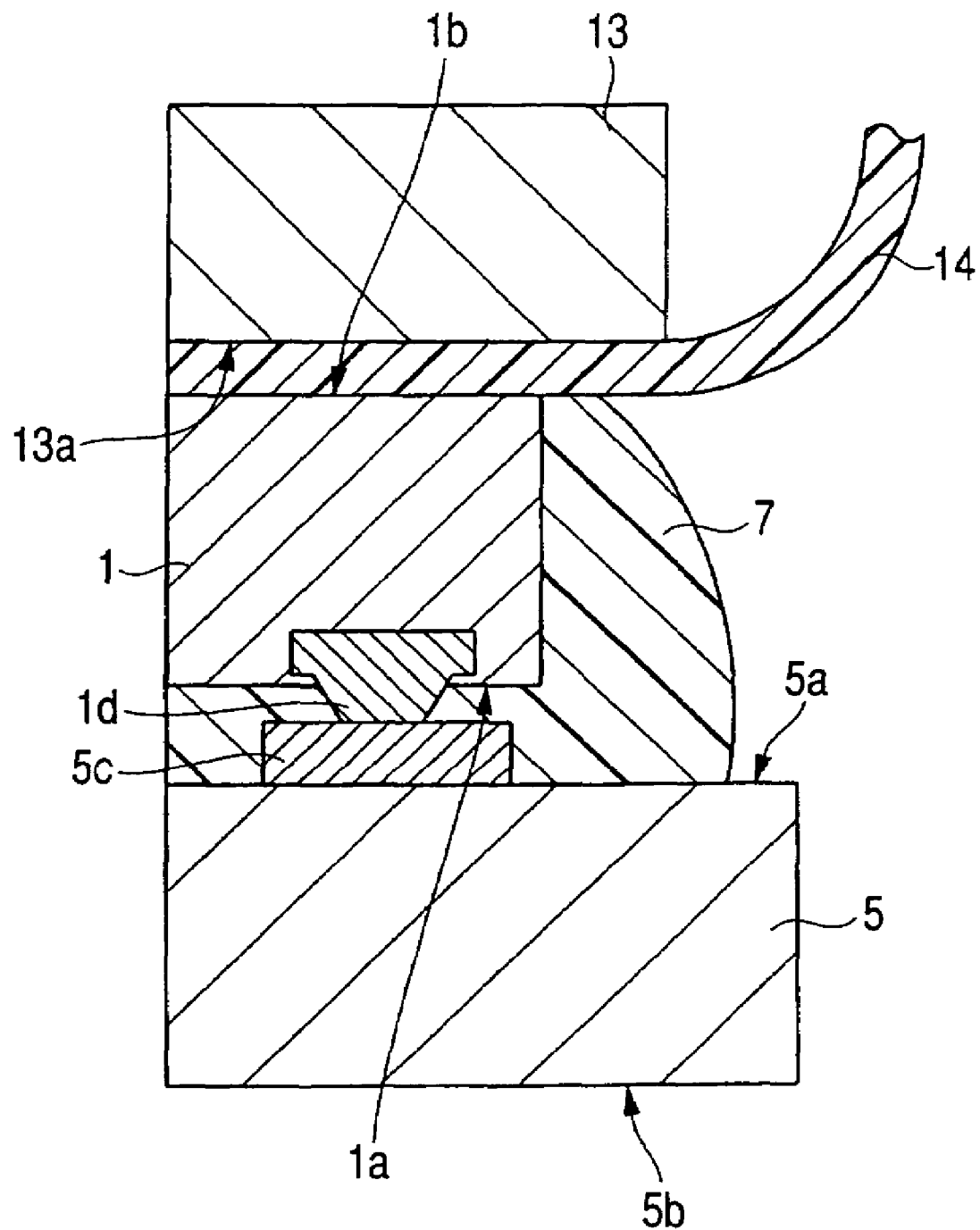
FIG. 11 is a partially enlarged sectional view showing the structure of portion A shown in FIG. 10.

In this embodiment, when the back surface 1b of the first semiconductor chip 1 is to be pressed by the pressure block 13, a sheet member 14 is interposed between the first semiconductor chip 1 and the pressure block 13, as shown in FIG. 11, to press the back surface 1b of the first semiconductor chip 1 by means of the pressure block 13, through the sheet member 14. The sheet member 14 has a thickness of about 50 μm, for example, and it is made of a fluororesin, for example. Since the fluororesin has high heat resistance and high releasability from a resin, a sheet member 14 made of a fluororesin is preferably used.

In this embodiment, the back surface 1b of the first semiconductor chip 1 to be flip-chip bonded is ground and then polished or wet etched so as to be flattened. Therefore, since the back surface 1b is very flat and has no large irregularities 9c of the type shown in the Comparative Example of FIG. 14, it is possible to prevent the NCP 7 from rising up and flowing onto the back surface 1b when the back surface 1b is pressed by the pressure block 13, as shown in FIG. 11.

That is, since the back surface 1b of the first semiconductor chip 1 is a planished flat surface, when the first semiconductor chip 1 is pressed by the pressure block 13, it is possible to prevent the NCP 7 that is rising along the side surfaces of the chip from flowing onto and adhering to the back surface 1b of the first semiconductor chip 1 in a space between the back surface 1b of the first semiconductor chip 1 and the sheet member 14, unlike the case where the NCP 7 flows onto and adheres to the back surface 18a of the chip 18, as seen shown in the Comparative Example of FIG. 15.

Further, since the pressing surface 13a of the pressure block 13 is covered with the sheet member 14, when the NCP 7 rises up, it is possible to prevent the NCP 7 from flowing onto and adhering to the pressure block 13 and the pressure block 13 from being stained by the NCP 7.

Figure 12:
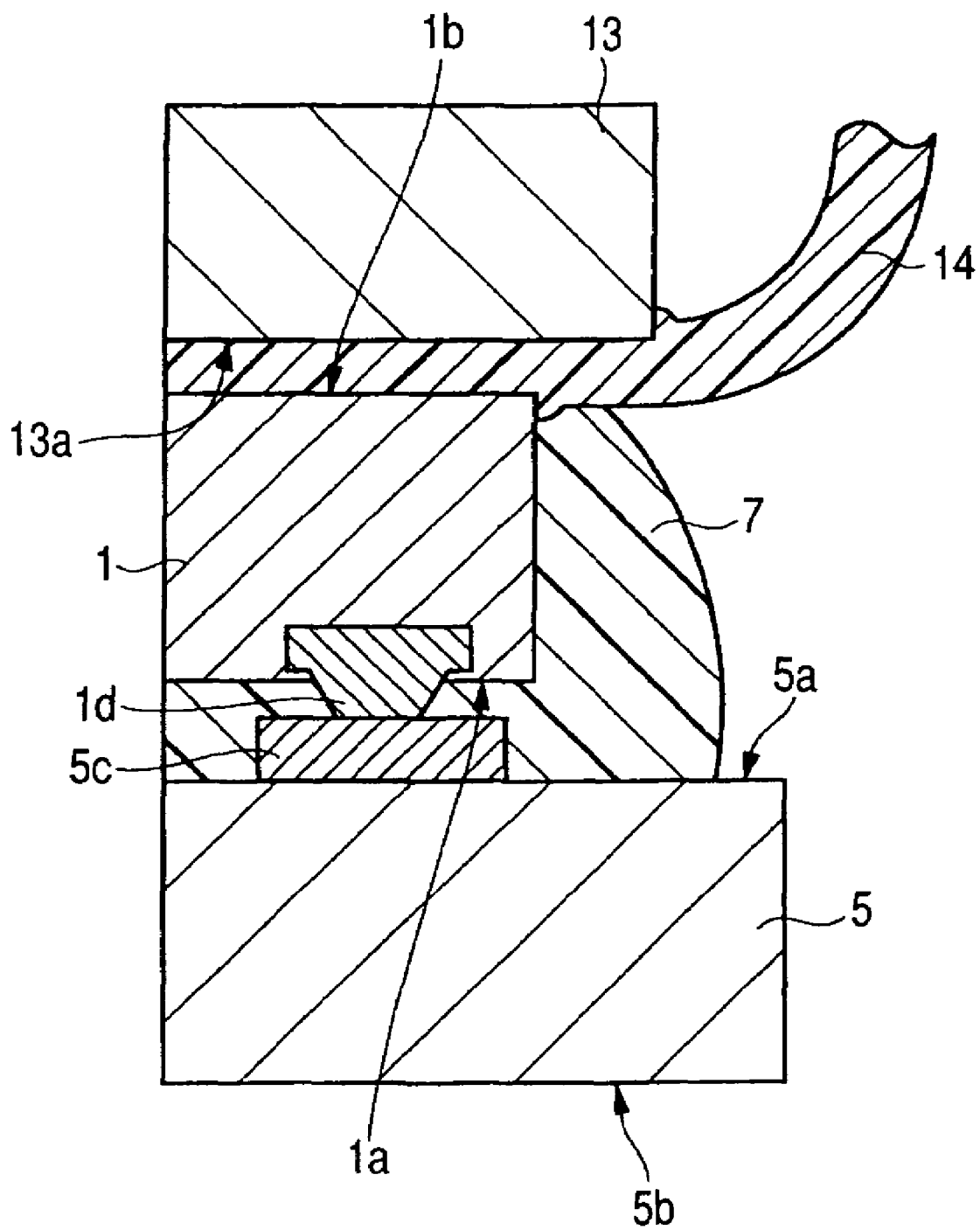
FIG. 12 is a partially enlarged sectional view showing a contact bonding method according to a modification of the embodiment of the present invention.

The first semiconductor chip 1 is made as thin as about 140 μm, and so the pressure load of the pressure block 13 cannot be made larger than required in consideration of the bending strength of the semiconductor chip 1. Therefore, as a means of preventing the NPC 7 from flowing onto and adhering to the back surface 1b of the first semiconductor chip 1 with more certainty, a sheet member 14 that is formed as a thick sheet, as shown in the modification of FIG. 12, may be used.

For example, a sheet member 14 as thick as about 100 μm is used, and the back surface 1b of the first semiconductor chip 1 is pressed to such an extent that it bites the sheet member 14, whereby the sheet member 14 and the back surface 1b of the first semiconductor chip 1 can adhere closely to each other. Therefore, it is possible to surely prevent the NCP 7 from flowing onto and adhering to the back surface 1b of the first semiconductor chip 1.

When the first semiconductor chip 1 is pressed using the pressure block 13, the sheet member 14 does not always need to be interposed between them. That is, when the adhesion of the NCP 7 to the back surface 1b of the first semiconductor chip 1 can be prevented without interposing the sheet member 14, due to close contact between the pressing surface 13a of the pressure block 13 and the back surface 1b of the first semiconductor chip 1 resulting from the back surface 1b of the first semiconductor chip 1 being a planished flat surface, the back surface 1b of the first semiconductor chip 1 may be pressed by the pressure block 13 without interposing the sheet member 14 therebetween.

The flip-chip bonding of the first semiconductor chip 1 is thus completed as shown in step S9 of FIG. 4.

The die bonding of the third semiconductor chip 3 in the SIP 16 is then carried out. As shown in FIG. 1, the third semiconductor chip 3 is bonded to the front surface 5a of the packaging board 5 by the die bonding agent 12 while the semiconductor chip is arranged in such a manner that the main surface 3a faces up. The die bonding agent 12 is, for example, a thermosetting resin adhesive.

Then, a second chip bonding is carried out, as shown in step S10 of FIG. 2. As shown in FIG. 1 and step S10 of FIG. 5, the second semiconductor chip 2 is fixed on the first semiconductor chip 1 and the fourth semiconductor chip 4 is fixed on the third semiconductor chip 3 by the die bonding agent 12, which is an adhesive.

That is, the semiconductor chip 2 is mounted over the back surface 1b of the first semiconductor chip 1 through the die bonding agent 12 while the semiconductor chip 2 is arranged in such a manner that its main surface 2a faces up, and the back surface 1b of the first semiconductor chip 1 and the back surface 2b of the second semiconductor chip 2 are bonded together by the die bonding agent 12.

Further, the fourth semiconductor chip 4 is mounted over the main surface 3a of the third semiconductor chip 3 through the die bonding agent 12 while the semiconductor chip 3 is arranged in such a manner that its main surface 4a faces up, and the main surface 3a of the third semiconductor chip 3 and the back surface 4b of the fourth semiconductor chip 4 are bonded together by the die bonding agent 12.

The above-mentioned die bonding agents 12 are, for example, a thermosetting resin adhesive.

Thereafter, wire bonding (W/B), as shown in step S11 of FIG. 2, is carried out. As shown in FIG. 1 and step S11 of FIG. 5, the second semiconductor chip 2, the third semiconductor chip 3 and the fourth semiconductor chip 4 are electrically connected to the wire connection leads 5f of the packaging board 5 by wires 6, such as gold wires.

Figure 6:
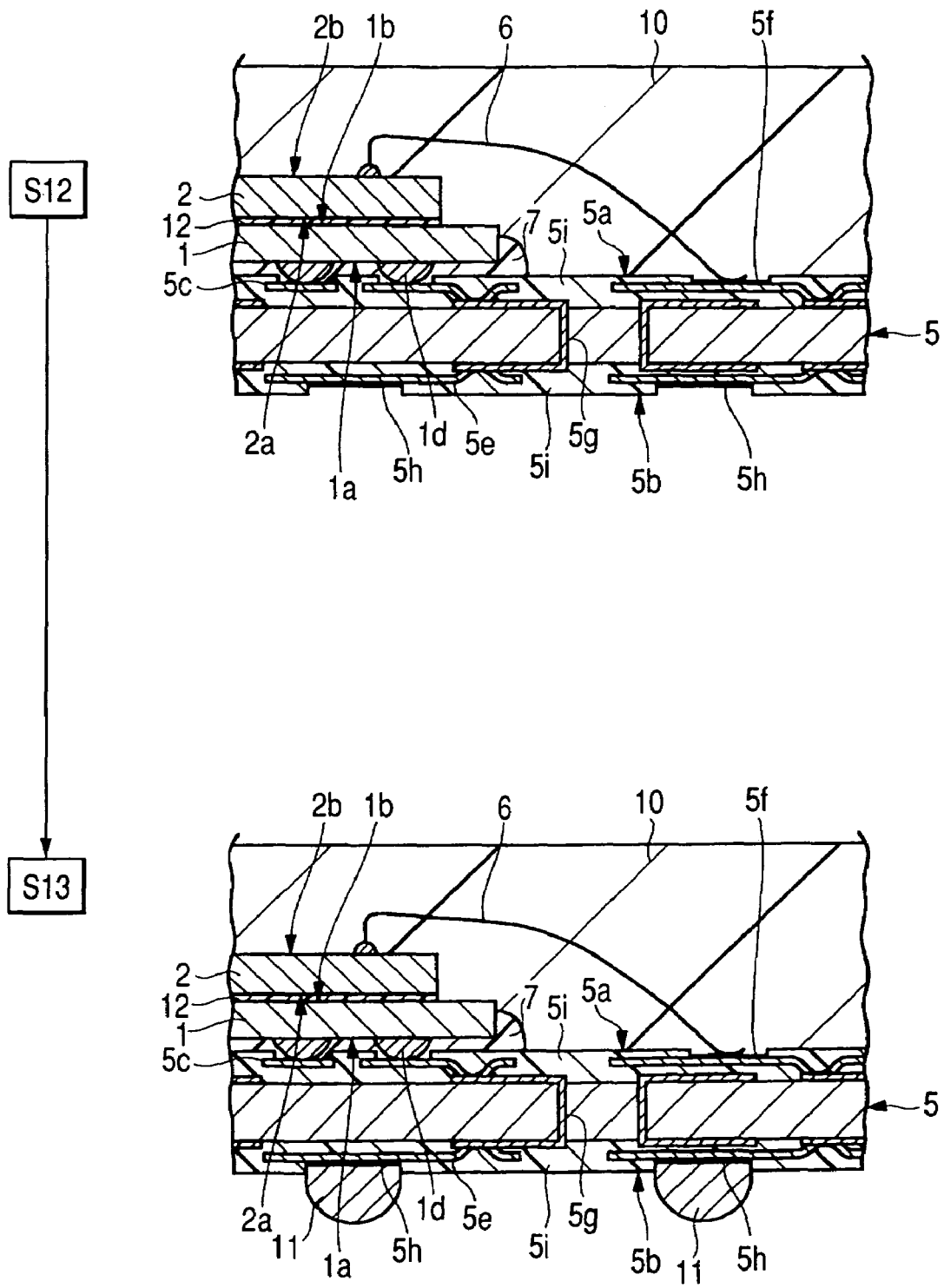
FIG. 6 is a flow diagram showing in sectional view the assembly states corresponding to steps S12 and S13 of the assembly flow shown in FIG. 2.

Molding as shown in step S12 of FIG. 2 is then carried out. As shown in FIG. 1 and step S12 of FIG. 6, the first semiconductor chip 1, the second semiconductor chip 2, the third semiconductor chip 3, the fourth semiconductor chip 4 and a plurality of wires 6 are sealed with a resin to form a sealing body 10. The sealing resin used for resin sealing is, for example, an epoxy-based thermosetting resin.

Thereafter, solder ball fixing, as shown in step S13 of FIG. 2, is carried out. As shown in FIG. 1 and step S13 of FIG. 6, a plurality of solder balls 11, which serve as external terminals, are formed on the bump lands 5h of the rear surface 5b of the packaging board 5. The solder balls 11 are heated to a molten state by a high-temperature treatment with a reflow so as to be fixed on the bump lands 5h.

Since adhesion of the NCP 7 to the back surface 1b of the first semiconductor chip 1 can be prevented in this embodiment, separation between the back surface 1b of the first semiconductor chip 1 and the sealing body 10 and separation between the back surface 1b of the first semiconductor chip 1 and the die bonding agent 12 of the second semiconductor chip 2 can be prevented.

This makes it possible to prevent the above-described separation and cracking that are caused by a high-temperature treatment with a reflow for fixing the solder balls 11, therefore making it possible to improve the reliability of the SIP 16 (semiconductor device).

When assembly is carried out by using a multi-cavity substrate, the substrate is cut into individual SIP's 16, as shown in step S14 of FIG. 2.

Figure 13:
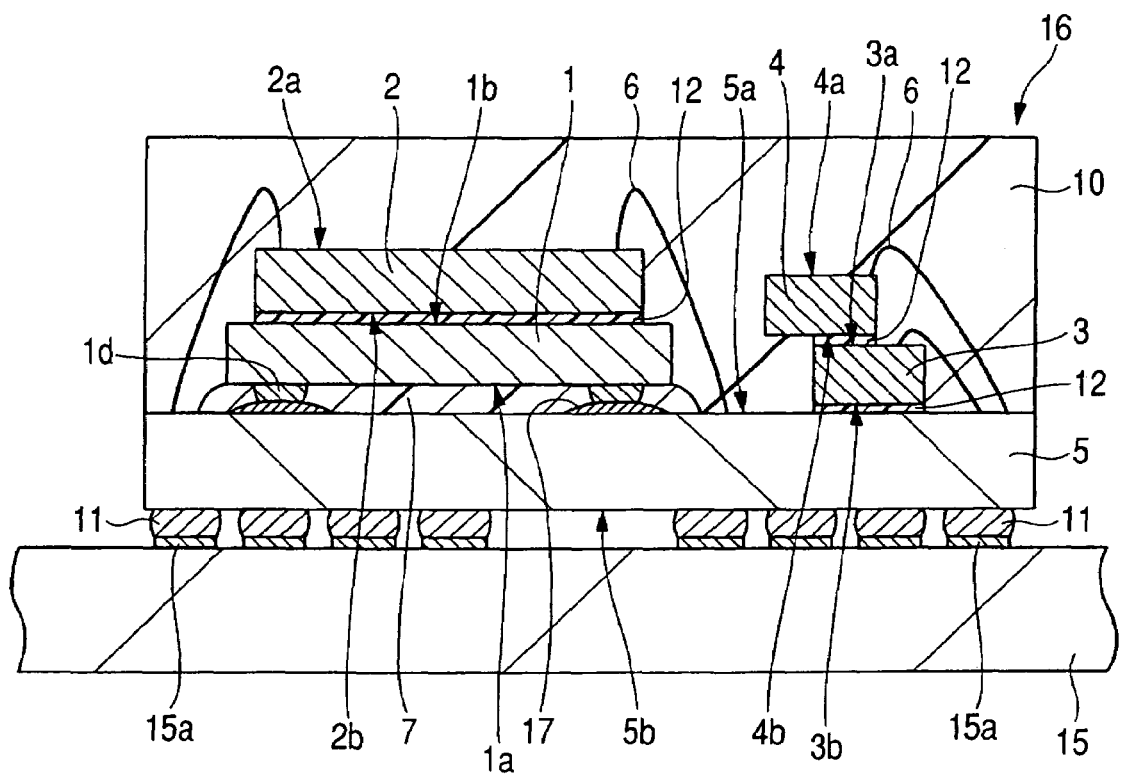
FIG. 13 is a partial sectional view showing the mounting of the semiconductor device shown in FIG. 1 to a packaging board.

Since bonding between the solder balls 11 and the terminals 15a of the packaging board 15 is carried out by a high-temperature treatment with a reflow for mounting the SIP 16 over the packaging board 15, as shown in FIG. 13, separation between the back surface 1b of the first semiconductor chip 1 and the sealing body 10 and between the back surface 1b of the first semiconductor chip 1 and the die bonding agent 12 of the second semiconductor chip 2 and cracking can be prevented, thereby making it possible to improve the reliability of the SIP 16.

A method of manufacturing a semiconductor device according to this embodiment has been described above for a case in which the step of reducing the thickness of the semiconductor wafer 9 by grinding the rear surface 9b is first carried out. Alternatively, in another example, a plurality of semiconductor chips which are made thin by grinding the back surfaces 1b and made flat by flattening the back surfaces 1b after grinding are prepared, stud bumps are formed on these semiconductor chips, as shown in step S5 of FIG. 2, and the semiconductor chips having gold bumps 1d are flip-chip bonded to assemble the semiconductor devices. That is, semiconductor chips which have been subjected to the steps S1 to S4 in FIG. 2 are fed, and steps S5 to S14 of FIG. 2 are carried out on these semiconductor chips to assemble the semiconductor devices.

While preferred embodiments of the invention which was made by the present inventors have been described above, it is needless to say that the present invention is not limited to the above-described embodiments and may be modified without departing from the spirit and scope of the invention.

For example, in the above-described embodiments, the gold bumps 1d are thermally contact bonded to the leads 5c of the packaging board 5 by solder bonding. However, the flip-chip bonding may be carried out by plating the surface of the leads 5c of the packaging board 5 with gold to contact-bond the gold bumps 1d to the gold plating of the leads 5c.

While the SIP 16 has been described as an example of the semiconductor device, the semiconductor device may be another type of device than the SIP 16, such as a BGA or LGA (Land Grid Array), and the advantages of the present invention will be attained if it is manufactured by flip-chip bonding at least one semiconductor chip, which has been made thin by a grinding and flattening of its rear surface, to a wiring substrate with a non-conductive resin adhesive.

The present invention is suitably used for electronic devices and semiconductor manufacturing technologies.

What is claimed is:

1. A method of manufacturing a semiconductor device, comprising the steps of:
   (a) reducing a thickness of a semiconductor wafer by grinding a rear surface of the semiconductor wafer;
   (b) after the step (a), flattening the rear surface of the semiconductor wafer;
   (c) after the step (b), dividing the semiconductor wafer into a plurality of semiconductor chips;
   (d) disposing a resin adhesive to a front surface of a wiring board;
   (e) after the step (d), holding a first semiconductor chip by using an adsorption block, and disposing the first semiconductor chip over the resin adhesive through a plurality of projecting electrodes formed on a main surface of the first semiconductor chip such that the main surface of the first semiconductor chip faces the front surface of the wiring board, wherein the first semiconductor chip is one of the plurality of semiconductor chips obtained by the step (c);
   (f) after the step (e), pressing a rear surface of the first semiconductor chip by using a pressure block arranged at a rear surface side of the first semiconductor chip through a sheet member, and electrically connecting the plurality of projecting electrodes of the first semiconductor chip with a plurality of electrodes formed on the front surface of the wiring board, wherein the rear surface of the first semiconductor chip opposes to the main surface of the first semiconductor chip;
   (g) after the step (f), mounting a second semiconductor chip over the rear surface of the first semiconductor chip through a die-bonding agent;
   (h) electrically connecting the second semiconductor chip with the wiring board through wires; and
   (i) sealing the first semiconductor chip, the second semiconductor chip and the wires with a resin,
   wherein the resin adhesive is not arranged between the rear surface of the first semiconductor chip and the second semiconductor chip.

2. The method of manufacturing a semiconductor device according to claim 1, wherein polishing is carried out in the step (b) to flatten the rear surface of the semiconductor wafer.

3. The method of manufacturing a semiconductor device according to claim 1, wherein wet etching is carried out in the step (b) to flatten the rear surface of the semiconductor wafer.

4. The method of manufacturing a semiconductor device according to claim 1, wherein the step (f) is performed while applying heat.

5. The method of manufacturing a semiconductor device according to claim 4, wherein said sheet member has a thickness of about 50-100 μm.

6. The method of manufacturing a semiconductor device according to claim 4, wherein the sheet member is made of a fluororesin.

7. The method of manufacturing a semiconductor device according to claim 1, wherein the resin adhesive is a non-conductive resin and a thermosetting resin.

8. The method of manufacturing a semiconductor device according to claim 1, wherein the die-bonding agent is a thermosetting resin.

9. The method of manufacturing a semiconductor device according to claim 1, wherein the sealing resin used in the resin sealing of the step (i) is a thermosetting resin.

10. The method of manufacturing a semiconductor device according to claim 1, wherein a plurality of solder balls are formed as external terminals over the rear surface of the wiring board after the step (i).

11. The method of manufacturing a semiconductor device according to claim 1, wherein solder is pre-coated over a plurality of electrodes to be flip-chip bonded over the front surface of the wiring board before the step (e).

12. The method of manufacturing a semiconductor device according to claim 11, wherein the pre-coated solder is used to connect gold bumps as the projecting electrodes for flip-chip bonding.

13. The method of manufacturing a semiconductor device according to claim 1, wherein a paste non-conductive resin adhesive is applied to the front surface of the wiring board in the step (e).

14. The method of manufacturing a semiconductor device according to claim 1, wherein in mounting the second semiconductor chip over the rear surface of the first semiconductor chip through the die-bonding agent, a rear surface of the second semiconductor chip, opposite to a surface of the second semiconductor chip having electrodes thereon, is connected to the rear surface of the first semiconductor chip by the adhesive.

15. The method of manufacturing a semiconductor device according to claim 1, wherein said adhesive through which the second semiconductor chip is mounted over the rear surface of the first semiconductor chip is an epoxy-based non-conductive thermosetting resin adhesive.

16. The method of manufacturing a semiconductor device according to claim 1, wherein said wires are gold wires.

17. The method of manufacturing a semiconductor device according to claim 1, wherein said grinding is performed so as to reduce the thickness of the wafer by more than one-half.

18. The method of manufacturing a semiconductor device according to claim 1, wherein said sheet member is made of a fluororesin.

19. The method of manufacturing a semiconductor device according to claim 1, wherein said sheet member has a thickness up to 100 μm.

* * * * *